(12) United States Patent
Carinci et al.

(10) Patent No.: US 10,775,461 B2
(45) Date of Patent: Sep. 15, 2020

(54) MAGNETIC RESONANCE SLICE MULTIPLEXING METHOD AND APPARATUS

(71) Applicant: Siemens Healthcare GmbH, Erlangen (DE)

(72) Inventors: Flavio Carinci, Erlangen (DE); Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 147 days.

(21) Appl. No.: 16/140,898

(22) Filed: Sep. 25, 2018

(65) Prior Publication Data

US 2019/0094321 A1     Mar. 28, 2019

(30) Foreign Application Priority Data

Sep. 25, 2017    (EP) .................... 17192871

(51) Int. Cl.
*G01R 33/483*     (2006.01)
*G01R 33/561*     (2006.01)
(Continued)

(52) U.S. Cl.
CPC ..... *G01R 33/4835* (2013.01); *G01R 33/4822* (2013.01); *G01R 33/5611* (2013.01);
(Continued)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS

2003/0016015 A1    1/2003   Eggers et al.
2013/0088225 A1*   4/2013   Weller ............... G01R 33/5611
                                             324/307

(Continued)

FOREIGN PATENT DOCUMENTS

JP        2005040464 A     2/2005

OTHER PUBLICATIONS

Breuer, et. al.: "Controlled Aliasing In Parallel Imaging Results in Higher Acceleration (CAIPIRINHA) for Multi-Slice Imaging"; Magnetic Resonance in Medicine; vol. 53; pp. 684-691; (2005).

(Continued)

*Primary Examiner* — Tung X Nguyen
(74) *Attorney, Agent, or Firm* — Schiff Hardin LLP

(57) ABSTRACT

In a magnetic resonance slice multiplexing method and apparatus, measurements are repeated with additional phase amounts being applied, wherein in each repetition, the additionally applied phase amounts are changed such that at least a central k-space region is fully sampled in the course of the repeated acquisitions. A calibration dataset, which is used in reconstructing image data for the simultaneously excited slices from the acquired measurement data, is determined from the measurement data that have been fully acquired in the central k-space region. The calibration dataset is updated in further measurements.

16 Claims, 4 Drawing Sheets

(51) Int. Cl.
*G01R 33/48* (2006.01)
*G01R 33/58* (2006.01)
*G01R 33/565* (2006.01)
*G01R 33/563* (2006.01)

(52) U.S. Cl.
CPC ...... *G01R 33/583* (2013.01); *G01R 33/56341* (2013.01); *G01R 33/56509* (2013.01)

(58) Field of Classification Search
CPC ............ G01R 33/4826; G01R 33/4828; G01R 33/483; G01R 33/4831; G01R 33/4833; G01R 33/4835; G01R 33/4836; G01R 33/4838; G01R 33/50; G01R 33/543; G01R 33/5602; G01R 33/5604; G01R 33/5605; G01R 33/5607; G01R 33/5608; G01R 33/561; G01R 33/5611; G01R 33/5612; G01R 33/5613; G01R 33/5614; G01R 33/5615; G01R 33/5616; G01R 33/5617; G01R 33/5618; G01R 33/5619; G01R 33/563; G01R 33/56308; G01R 33/56316; G01R 33/56325; G01R 33/56333; G01R 33/56341; G01R 33/5635; G01R 33/56358; G01R 33/56366; G01R 33/56375; G01R 33/56383; G01R 33/56391; G01R 33/565; G01R 33/56509; G01R 33/56518; G01R 33/56527; G01R 33/56536; G01R 33/56545; G01R 33/56554; G01R 33/56563; G01R 33/56572; G01R 33/56581; G01R 33/5659; G01R 33/567; G01R 33/5673; G01R 33/5676
See application file for complete search history.

(56) References Cited

U.S. PATENT DOCUMENTS

| | | |
|---|---|---|
| 2016/0069974 A1 | 3/2016 | Lee et al. |
| 2016/0209487 A1* | 7/2016 | Stern ................. G01R 33/4806 |
| 2017/0212199 A1* | 7/2017 | Itriago Leon ...... G01R 33/5608 |
| 2018/0074147 A1 | 3/2018 | Carinci et al. |
| 2018/0095150 A1 | 4/2018 | Zeller |
| 2018/0217219 A1 | 8/2018 | Beck et al. |
| 2018/0348323 A1 | 12/2018 | Carinci et al. |

OTHER PUBLICATIONS

Zhu, et al. "Simultaneous Multi-slice Flyback Echo Planar Imaging with Auto-calibration"; Proceedings Of The International Society For Magnetic Resonance In Medicine; 21st Annual Meeting & Exhibition; (2013).

Breuer, et al. "Dynamic Autocalibrated Parallel Imaging Using Temporal GRAPPA (TGRAPPA)" Magnetic Resonance in Medicine, vol. 53, pp. 981-985, (2005).

Zahneisen, et al. "Three-Dimensional Fourier Encoding of Simultaneously Excited Slices: Generalized Acquisition and Reconstruction Framework", Magnetic Resonance in Medicine, vol. 71, pp. 2071-2081; (2014).

Setsompop, et al.: "Blipped?controlled aliasing in parallel imaging (blipped-CAIPI) for simultaneous multislice echo planar imaging with reduced g?factor penalty";: Magnetic Resonance in Medicine; vol. 67,5; pp. 1210-1224; (2012).

\* cited by examiner

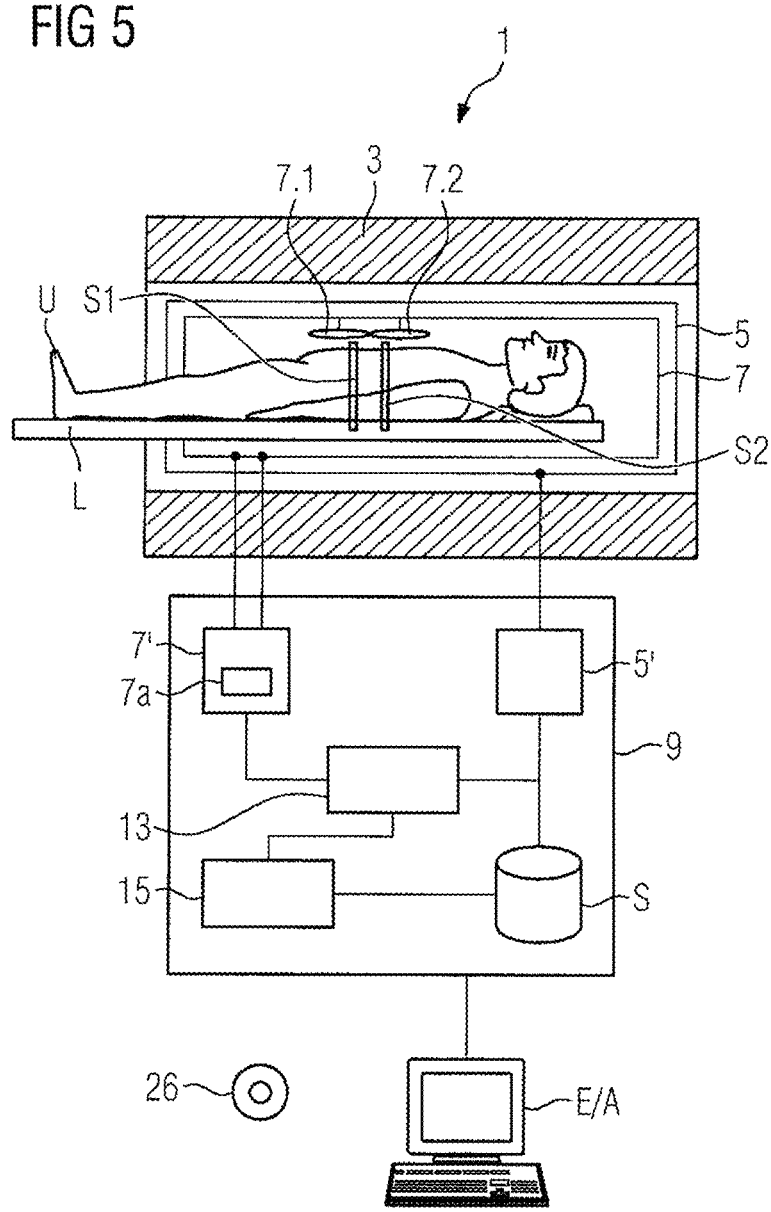

MAGNETIC RESONANCE SLICE MULTIPLEXING METHOD AND APPARATUS

BACKGROUND OF THE INVENTION

Field of the Invention

The present invention concerns a method and apparatus for producing measurement data from at least two non-overlapping slices of a subject under examination by magnetic resonance technology using a measurement sequence, of the type that specifies measurement points on a k-space trajectory and acquires echo signals from at least two non-overlapping slices simultaneously.

Description of the Prior Art and Related Subject Matter

Magnetic resonance (the abbreviation MR is used below for magnetic resonance) is a known technology, which can be used to generate images of the inside of a subject under examination. In simple terms, this is done by placing the subject under examination in a magnetic resonance data acquisition scanner in a strong static, homogeneous basic magnetic field, also called the $B_0$ field, at field strengths of 0.2 tesla to 7 tesla and higher, with the result that the nuclear spins of the subject are oriented along the basic magnetic field. Radio-frequency excitation pulses (RF pulses) are applied to the subject under examination in order to induce nuclear spin resonances. The induced nuclear spin resonance signals are spatially encoded by rapidly switched magnetic gradient fields that are superimposed on the basic magnetic field. The recorded measurement data are digitized and stored in a memory as complex numerical values as so-called k-space data, in a matrix. An associated MR image can be reconstructed from the k-space matrix, populated with values, using a multidimensional Fourier transform, for example. Spectroscopic data can also be obtained.

In order to improve the signal-to-noise ratio (SNR) in MR measurements or to reduce a sensitivity of the measurement to movement and/or flow, it is standard practice in many acquisitions to acquire measurement data repeatedly in order to be able to perform averaging on the measurement data, or on the reconstructed image data.

The desire for ever faster MR acquisitions in the clinical environment is currently leading to renewed interest in techniques in which a number of images are acquired simultaneously. These techniques can be characterized generally as selectively using for the imaging process, at least during part of the measurement, transverse magnetization of at least two slices simultaneously ("multi-slice imaging", "slice multiplexing"). In contrast, in established multi-slice imaging, the signal is acquired from at least two slices alternately, i.e. fully independently from one another, with corresponding longer measurement time.

Examples of known techniques for this purpose are so-called Hadamard encoding, techniques that use simultaneous echo refocusing, techniques that use wide-band data acquisition, or even techniques that employ parallel imaging in the slice direction. The latter techniques include, for example, also the CAIPIRINHA technique, as described by Breuer et al. in "Controlled Aliasing in Parallel Imaging Results in Higher Acceleration (CAIPIRINHA) for Multi-Slice Imaging", Magnetic Resonance in Medicine 53, 2005, pages 684-691, and the blipped CAIPIRINHA technique, as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pages 1210-1224.

In particular, the latter slice-multiplexing techniques often use a multiband RF pulse in order to excite or otherwise manipulate, e.g. refocus or saturate, two or more slices simultaneously. Said multiband RF pulse is, for instance, a multiplex of individual RF pulses that would have been used to manipulate the individual slices which are to be manipulated simultaneously. The multiplexing results in, for example, a baseband-modulated multiband RF pulse from adding the pulse waveforms of the individual RF pulses. The spatial encoding of the acquired signals is achieved here essentially by conventional gradient switching in two directions (two-dimensional gradient encoding). It is also possible, however, to use individual, e.g. successively switched RF pulses, to excite and manipulate the slices to be excited, from which echo signals are acquired simultaneously jointly in one measurement-data acquisition. It is also possible to use "single-slice" RF pulses and multiband RF pulses in combination.

The resultant signals are acquired by means of a number of reception antennas from all the excited slices in collapsed form in one dataset, and then the acquired data are separated according to the individual slices using parallel acquisition techniques.

Such parallel acquisition techniques (ppa techniques) can be used to shorten the duration of the data acquisition time by undersampling k-space means that not every available data point in the memory organized as k-space is filled with a data entry, and thus some k-space points are empty (unfilled or unscanned). When the number of such unfilled points in k-space, or within a specified region of k-space, causes the totality of points in k-space, or in that region, not to satisfy the Nyquist criterion, k-space, or that region of k-space, is said to be undersampled. Such techniques include, for example, GRAPPA ("GeneRalized Autocalibrating Partially Parallel Acquisition") and SENSE ("SENsitivity Encoding"). The measurement points in k-space that are not filled due the undersampling that is used in parallel acquisition techniques are usually distributed evenly over the region (some or all) of k-space that is to be scanned in accordance with the Nyquist criterion, such as by every second (every other) k-space line being scanned (filled with data). In addition, the "missing" k-space data in parallel acquisition techniques are reconstructed using coil-sensitivity data. This coil sensitivity data for the reception coils used in the acquisition of the measurement data are determined from reference measurement data, which sample fully, according to the Nyquist criterion, at least a region of k-space to be measured, usually the central region.

In slice multiplexing methods, parallel acquisition techniques are used for re-separating the measurement data acquired simultaneously for different slices. This requires reference measurement data to be acquired for all the slices concerned. This is usually done as part of a reference measurement performed in addition to the diagnostic data acquisition. In the reference measurement, the reference measurement data are acquired separately for each required slice.

In order to be able to separate the resultant signals obtained from the different slices, a different phase is applied in each case to the individual RF pulses before the multiplexing, such as by adding a phase amount that increases linearly (e.g. with the k-space coordinate in the phase-encoding direction ($k_y$)). A different phase gradient can hence be applied to each slice, thereby shifting the slices in the image domain with respect to one another. This shift is controlled by a factor called the "FOV shift factor" (field of view shift factor) or "interslice FOV shift". For example, DE102016218955 describes how an optimum FOV shift factor can be determined.

In the CAIPIRINHA technique described in the cited articles by Breuer et al. and Setsompop et al., alternating phase shifts are applied between the simultaneously excited slices by switching additional gradient blips or by additional phase modulation of the RF pulses (of the multiband RF pulses), which phase shifts produce the aforementioned shifts in image space. The additional shifts in image space improve the quality of the separation of the signals obtained from the slices, particularly if the coil sensitivities exhibit such small differences in the sensitivity profiles of the individual coils used that they are inadequate for reliable separation of the slices. Artifacts are thereby reduced in the image data ultimately reconstructed from the measured measurement data.

FIG. 1 shows an example that contrasts different sampling patterns of k-space for GRAPPA-type parallel imaging techniques, each having an acceleration factor 2 and a three-dimensional (3D) Cartesian sampling pattern, which in each case samples k-space lines in the ky-kx plane. In FIG. 1, the kx-direction, in which the represented k-space lines run in the example, lies perpendicular to the plane of the page, and the sampling pattern is always the same in the kx-direction. The solid circles represent measured k-space points; the empty circles represent omitted k-space points. The sampling pattern at the left shows a conventional GRAPPA sampling in which every second k-space line in one spatial direction (in this case the kz-direction) is omitted, and hence only half of the k-space points are measured.

The effect of the additional phase shifts on the sampling pattern of a two-dimensional (2D) slice multiplexing measurement can be described as follows (see the right side of FIG. 1): the additional phases, which are applied in CAIPIRNHA slice multiplexing techniques, shift the measurement points to which the additional phase has been applied by an offset in k-space in the kz-direction. The size of this offset in the kz-direction depends on the applied phase. This is described, for example, in the article by Zahneisen et al.: "Three-Dimensional Fourier Encoding of Simultaneously Excited Slices: Generalized Acquisition and Reconstruction Framework", Magn. Reson. Med. 71, pages 2071-2081 (2014).

The reference measurement data, from sensitivity data are obtained for separating the simultaneously acquired slices and/or for creating missing measurement data, must be measured additionally in advance for every SMS measurement. The additional acquisition of the reference measurement data increases the acquisition time needed overall and the SAR load (SAR: specific absorption rate) when using a slice-multiplexing technique, and hence reduces the advantages sought by these techniques, namely a reduced measurement time and SAR load compared with single-slice methods.

In addition, differences in the measurement parameters used in acquiring the reference measurement data from the measurement parameters used in the slice multiplexing measurement, in particular measurement parameters relating to the properties of the RF excitation pulses and/or relating to the readout process, for instance readout bandwidth, can affect the quality of the separation of the slices and result in unwanted artifacts. In this context, US Patent Application Publication No. 2018/0074147 describes various methods whereby such reference measurement data can be obtained alongside the slice multiplexing measurement data, although the reference measurement data must still be acquired in addition to the measurement data.

In order to be able to separate with minimum possible interference the measurement data acquired from the number of slices in collapsed form into measurement data for the individual slices, the acquisitions of the reference measurement data for the individual slices should be implemented using the same slice position and slice orientation as the measurement data acquired simultaneously in a slice multiplexing measurement. If the position or orientation of a slice to be acquired changes in the course of an MR measurement, for instance by an (unintentional) movement of the subject under examination, in particular during prolonged MR measurements, or even by an intentional/deliberate change by the medical technician, then for the altered orientation and/or position, reference measurement data must be acquired again for the slices that still need to be acquired, in order to continue to be able to ensure correct separation of the slices. Prolonged MR measurements may be MR measurements in which a time series of MR images is produced in order to be able to investigate the variation over time of a depicted parameter, as is the case, for instance, in EPI-BOLD measurements or diffusion measurements.

Deliberate changes in orientation or position of acquired slices are required in the context of MR-guided interventions, in which, for example, the path of a medical device such as a catheter is tracked in the subject under examination, as well as when tracking embolizations or monitoring HIFU ("high intensity focused ultrasound") techniques.

Re-acquisition of reference measurement data is not always possible, however, and in any case entails the disadvantages noted above (extending the total measurement time/SAR load). Dispensing with re-acquisition of reference measurement data diminishes the quality of the separation of the measurement data obtained from the individual slices, which results in image artifacts in the MR data ultimately obtained. For these reasons, slice multiplexing techniques are not often employed for MR measurements that are used to produce time series or in which changes are expected in the position and/or orientation of the slices to be acquired.

For single-slice ppa techniques, Breuer et al., for example, describe in the article "Dynamic Autocalibrated Parallel Imaging Using Temporal GRAPPA (TGRAPPA)", Magnetic Resonance in Medicine 53, 2005, pages 981-985, how calibration data can be updated in the course of a plurality of ppa measurements. The techniques described in this article, however, are confined to the variation of k-space lines in the phase-encoding direction (usually the $k_y$-direction) for a two-dimensional GRAPPA reconstruction and therefore cannot be applied to slice multiplexing methods.

The subsequently published DE102017201477 describes a method that detects a movement of the subject under examination and takes into account the ascertained movement in recalculating local weighting matrices used for the slice separation and/or for replenishing slice measurement data. To do this, however, the reference data to be acquired for the weighting matrix must cover a larger volume than would be necessary without this recalculation. Furthermore, the recalculation requires complex calculation steps and hence is not easy to implement.

SUMMARY OF THE INVENTION

An object of the invention is to provide for the use, in a manner that is easy to implement, of MR-data acquisitions accelerated by slice multiplexing techniques for MR measurements in which at least one change is expected in the measurement conditions, for instance in the position and/or the orientation of the slices to be acquired, in the course of the MR measurement.

In accordance with the invention, the reference measurement can be acquired using an acquisition sequence that differs from the imaging measurement, but preferably using a similar contrast.

A method according to the invention for generating measurement data from a subject under examination by operation of a magnetic resonance scanner includes the following steps.

(a) Repeatedly applying at least one RF excitation pulse from an RF radial or of the scanner, wherein the applied RF excitation pulses selectively excite at least two non-overlapping slices in the subject under examination, and switching gradients produced by a gradient coil arrangement of the scanner such that echo signals are generated in the at least two slices by the switched gradients and the applied RF excitation pulses, and such that the generated echo signals are acquired and provided to a computer and are stored in a memory organized as k-space, as measurement data in one measurement dataset per repetition on the basis of one different sampling pattern per repetition that is used in the computer as a 3D sampling pattern, wherein each sampling pattern employed is undersampled according to Nyquist, and wherein a combination of the sampling patterns employed in the repetitions fully samples k-space at least in a central region.

(b) Calibration data are determined by the computer from measurement data of the stored measurement datasets from the fully sampled central region of k-space.

(c) Image data for each of the slices from at least one of the stored measurement datasets are reconstructed by the computer using the calibration data.

(d) Steps (a) and (c) are repeated, wherein latest calibration data is determined at least once from latest measurement data, which are used for reconstructing image data for the slices from latest measurement datasets.

As additionally described in the article already mentioned by Zahneisen et al., selecting the required shift in image space to be by a multiple of the Nth part of the field of view FOV (for N simultaneously excited slices) results in a shift in the measured k-space points in k-space (in the kz-direction) by an amount that corresponds to full Nyquist sampling in this k-space direction. Thus a 2D slice multiplexing measurement can be viewed in an analogous way to a 3D CAIPIRIHNA measurement.

The invention is based on the insight that considering a 3D measurement in this way, and thus viewing the sampling pattern used for slice multiplexing measurements likewise as a 3D sampling pattern, provides a way that is easy to implement of selecting different sampling patterns that, although they undersample k-space individually, in combination fully sample k-space at least in a central region.

By using, according to the invention, the different sampling patterns that are each viewed as 3D sampling patterns, it is possible to update previously determined calibration data during the measurement. Acquisitions of calibration data that are separate from the acquisition of the measurement data can be omitted entirely, thereby saving measurement time and keeping the SAR load low.

The updating of calibration data according to the invention in a manner that is easy to implement improves the image quality of the image data produced from the measurement data acquired in an accelerated manner, because not only are the calibration data that are used for the reconstruction determined directly from the acquired measurement data, and hence are inherently optimally aligned with that data, but also, by the updating of the calibration data, calibration data are also available that have been adapted to any changed measurement conditions at that time, thereby allowing the separation of the simultaneously acquired measurement data into single-slice measurement data, and causing any replenishment that may be required of single-slice measurement data acquired in an accelerated manner, to be of consistently good quality even after changes in the measurement conditions.

By virtue of the updating of the calibration data according to the invention, slice multiplexing techniques can be employed usefully for MR measurements in which position changes occur in the course of the MR measurement, because calibration data updated according to the invention takes account of such changes. It is thereby possible to use slice multiplexing techniques for monitoring interventions (which requires real-time reproduction of the acquired image data), and hence to perform such monitoring with better resolution and/or shorter measurement time per image and yet with high image quality.

In diffusion techniques, in which MR measurements are performed using different b-values and/or in different diffusion directions, calibration data determined according to the invention allow an image quality that is good regardless of the changed measurement conditions (b-values/diffusion directions), and reduces or even prevents image distortions that are often caused by eddy currents, which can arise from the changes in the measurement conditions.

The different sampling patterns that are employed can each have identical undersampling and an identically applied shift in the image domain in the slice direction, making implementation even easier.

Sampling patterns according to the invention can be produced particularly easily by a permutation of an initial sampling pattern. The different sampling patterns employed thus differ from one another by a permutation, in particular a cyclic permutation. The positions of the measurement points in k-space can be the subject of the permutation in this process, with an additional phase amount being applied to these measurement points in order to apply a shift in the image domain in the slice direction.

A magnetic resonance apparatus according to the invention has a data acquisition scanner with a basic field magnet, a gradient coil arrangement, a radio-frequency transmitter/receiver antenna arrangement, and a control computer designed to operate the scanner so as to implement the method according to the invention, via a radio-frequency transmit/receive controller and a phase determination processor.

The present invention also encompasses a non-transitory, computer-readable data storage medium encoded with programming instructions (program code) that, when the storage medium is loaded into a computer or a computer system of a magnetic resonance apparatus, cause the computer or computer system to operate the magnetic resonance apparatus so as to implement any or all embodiments of the method according to the invention, as to described above.

The described advantages and embodiments of the method apply analogously to the magnetic resonance apparatus and to the electronically readable data storage medium.

BRIEF DESCRIPTION OF THE DRAWINGS

FIG. 5 is a schematic illustration of a magnetic resonance apparatus according to the invention.

DESCRIPTION OF THE PREFERRED EMBODIMENTS

Figure 2:
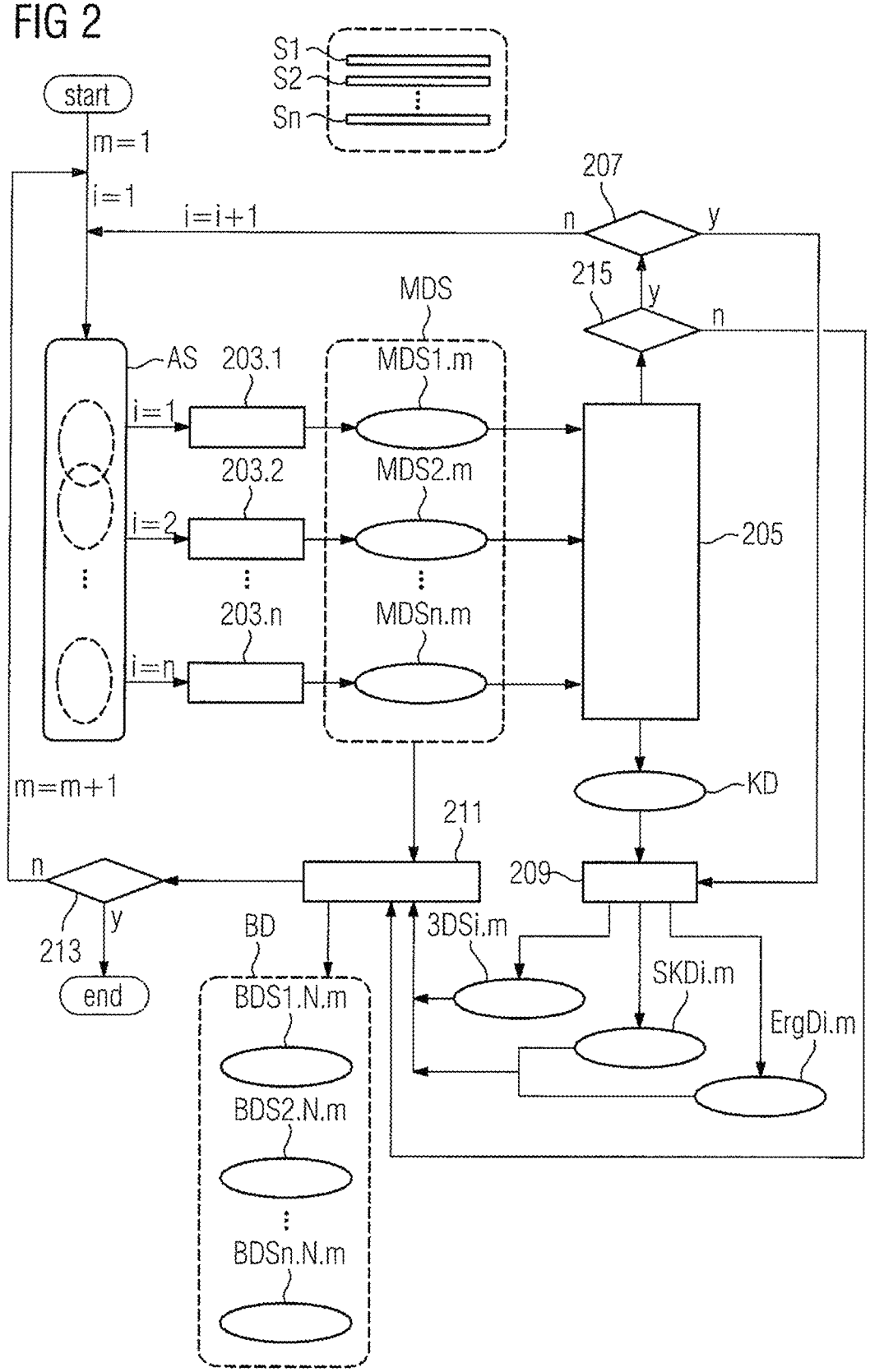
FIG. 2 is a flowchart of the method according to the invention.

FIG. 2 is a flowchart of the method according to the invention for generating measurement data from a subject under examination by using magnetic resonance technology.

After the start ("start") of a method according to the invention, initially at least two sampling patterns AS, which are different viewed three-dimensionally, can be defined, on the basis of which, measurement data from N non-overlapping slices is meant to be acquired. A three-dimensional view is understood to mean here viewing the sampling patterns in three-dimensional k-space, i.e. in all three k-space directions, which sampling patterns define the k-space positions at which measurement points lie. Each of the sampling patterns AS is undersampled according to Nyquist at least in the three-dimensional view. The sampling patterns AS are selected, however, such that they specify measurement points in k-space in such a way that a combination of the measurement points in k-space that are sampled in each of the n sampling patterns fully sample k-space at least in a desired central region.

The sought different sampling patterns AS to be employed can be obtained here by permutation of certain attributes of an initial sampling pattern, whereby the different sampling patterns AS to be employed differ from one another by this permutation. In particular here, an initial sampling pattern can be permuted according to k-space positions assigned additional phases, whereby suitable sampling patterns can be produced particularly easily, which sampling patterns moreover each have identical undersampling and applied shift in image space in the slice direction. Selecting the different sampling patterns AS to be employed such that they each have identical undersampling (acceleration both by collapsed acquisition of measurement data from a plurality of slices and also within the slices) and applied shift of the slices in image space (interslice FOV shift), makes the ultimately reconstructed image data more comparable.

N slices of a subject under examination are selectively excited by applying at least one RF excitation pulse and by switching gradients so that echo signals are generated in the N slices. The applied RF excitation pulses may be at least one multiband RF excitation pulse or may be RF excitation pulses that each excite one slice of the N slices, or may be a combination of at least one multiband RF excitation pulse and RF excitation pulses that each excite one slice of the N slices.

The applied RF excitation pulses and switched gradients acquire the generated echo signals on the basis of an initial sampling pattern AS i=1 as measurement data, which is stored in a measurement dataset MDS1.m (block 203.1). Calibration data KD are determined from measurement data of the stored measurement data MDS (block 205). This is done by collecting at least the measurement data of the measurement datasets that lies in a desired central region of k-space. If complete measurement data is not yet available in the central region of k-space, and thus measurement datasets MDS have not yet been acquired on the basis of all the intended sampling patterns AS (query 207, n), the acquisition of a new measurement dataset MDS for the N slices is repeated on the basis of a sampling pattern i=i+1 that has not yet been performed. If applicable, the query 207 is repeated after every fulfillment of a trigger condition (see query 215 below). The acquisition of measurement datasets MDS for the N slices is performed a total of n (n>1) times, wherein RF excitation pulses are applied in such a way, and gradients are switched such that a different three-dimensionally viewed sampling pattern AS is obtained for each repetition i (blocks 203.i), and respective measurement datasets MDSi.m (i=1, 2, . . . , n) for the N slices are acquired.

If measurement datasets MDS have already been acquired on the basis of all the intended sampling patterns AS (query 207, y) and hence a complete set of measurement data in the central region of k-space is available in the combined measurement datasets MDS, from which it was possible to determine calibration data KD, three-dimensional calibration datasets 3DSi.m can be produced from the calibration data KD, for instance using a 3D parallel acquisition technique, which calibration datasets can be used to replenish the respective measurement datasets MDSi.m, which have been acquired in undersampled form, (block 209). It is also possible to determine, for the respective individual slices, slice separation data SKDi.m for separating the signals from all N slices (which signals are contained in the measurement data acquired in the measurement datasets MDSi.m, into slice measurement datasets SMDSi.N.m (not shown)) from the determined calibration data KD. This can be done using a parallel acquisition technique that is known for separating measurement data acquired in collapsed form from a number of slices (block 209). If the determined slice measurement datasets SMDSi.N.m of the respective individual slices are themselves in undersampled form, it is also possible, for instance using a 2D parallel acquisition technique, to determine, from the determined calibration data KD, replenishment data ErgDi.m for replenishing the slice measurement datasets SMDSi.N.m so as to produce complete slice measurement datasets SMDSi.N.m' (not shown) (block 209).

The calibration data KD are used to reconstruct image data BD for each of the N slices from at least one of the stored measurement datasets MDSi.m, with the result that N image datasets BDSi.N.m are reconstructed for each intended measurement dataset MDSi.m (block 211).

If three-dimensional calibration datasets 3DSi.m have been produced from the calibration data KD, in this case the intended measurement datasets MDSi.m can be replenished using the associated three-dimensional calibration datasets 3DSi.m to produce complete three-dimensional measurement datasets MDSi.m' (not shown), and the associated image datasets BDSi.N.m can be reconstructed from the replenished measurement datasets MDSi.m', for example by a three-dimensional Fourier transform.

If slice separation data SKDi.m for separating the signals from all N slices (which signals are contained in the measurement data acquired in the measurement datasets MDSi.m) into slice measurement datasets SMDSi.N.m for the individual slices have been determined from the calibration data KD, first the slice measurement datasets SMDSi.N.m can be produced, and then the associated image datasets BDSi.N.m can be reconstructed from each of these datasets, for instance using a 2D Fourier transform.

If determined slice measurement datasets SMDSi.N.m are themselves in undersampled form, and if additionally replenishment data ErgDi.m for replenishing the slice measurement datasets SMDSi.N.m to produce complete slice measurement datasets SMDSi.N.m' have been determined, first the undersampled slice measurement datasets SMDSi.N.m can be replenished using the associated replenishment data ErgDi.m, for instance according to a suitable parallel acquisition technique, to produce complete slice measurement datasets SMDSi.N.m', and then the associated image datasets BDSi.N.m can be reconstructed from each of these datasets, for instance using a 2D Fourier transform.

When all the required image data BD are already produced accordingly (query 213, y), the method ends ("end").

If all the required image data BD have not yet been reconstructed (query 213, n), although at least once, the acquisition of measurement data MDSi.m on the basis of the intended sampling patterns AS (blocks 203.$i$) and the reconstruction of the image data BD is repeated for at least one sampling pattern (block 211). Hence at least two image datasets BDSi.N.1 and BDSi.N.2 are produced in at least two repetitions m=1 and m=2, which are performed at separate times, for one of the N slices and one of the n repetitions of the acquisition of measurement data using sampling pattern i.

It is possible for the latest calibration data KD, which are used for reconstructing image data for the slices from latest measurement datasets, to always be determined (query 215 (obsolete) always fulfilled, y), in particular after every acquisition of measurement datasets MDSi.m, from latest measurement data of the measurement datasets MDSi.m. For instance, measurement data currently acquired in a latest, last acquisition of measurement data 203.$i$ can directly replace in the calibration data KD, measurement data acquired for the same k-space position in an earlier acquisition of measurement data, so that the calibration data KD can be updated at the corresponding k-space positions with every re-acquisition of measurement data 203.$i$. From the calibration data KD updated in this way, it is possible to produce updated three-dimensional calibration datasets 3DSi.m and/or to determine updated slice separation data SKDi.m and/or updated replenishment data ErgDi.m (see block 209).

Constantly updated calibration data KD also always ensure, for the reconstruction of image data BD, calibration data KD that are optimally aligned with the acquired measurement datasets MDSi.m, and hence optimum reconstruction results.

It is also possible, however, for the latest calibration data to be determined on fulfillment of a trigger condition (query 215, y); if the trigger condition is not fulfilled (query 215, n), existing calibration data KD can be used for reconstructing the image data BD from measurement datasets MDSi.m (m>1)(block 211). The trigger condition is in any case fulfilled here as long as a complete set of calibration data KD has not yet been determined.

When the calibration data KD are updated only on a trigger condition being fulfilled, the computational effort is kept low, and adapting the calibration data, and hence adapted reconstruction of image data BD, is carried out only when required.

This trigger condition may be fulfilled as soon as a measurement condition is changed by a user input, for instance if a user changes imaging parameters (e.g. the slice orientation) of the measurement. This ensures that latest calibration data that has been adapted to the changed measurement conditions is produced.

Additionally or alternatively (regardless of the nature of the acquired measurement data), a movement of the subject under examination or even of an element such as a catheter, for example, situated in the subject under examination, can be detected, and the trigger condition can be fulfilled when the detected movement exceeds a specified threshold value. The movement of the subject under examination can be detected here in a known manner by external sensors, for instance physiological sensors, or by the use of MR navigator measurements. Monitoring the movement of the subject under examination in this way can automatically initiate an update of the calibration data when a movement lies above the threshold value, so it is possible to ensure, even in the event of changes in orientation and/or position of the measured slices, a high image quality of the image data reconstructed using the updated calibration data.

Additionally or alternatively, the trigger condition may be fulfilled as soon as the measurement conditions change as a result of (e.g. measurement-induced) changes in the hardware used for the measurement; for example when the temperature e.g. of the gradient coil rises by more than a specified threshold value, for instance by more than 10 degrees during the measurement. Such a change in the hardware conditions can be detected by external sensors, for example, which can initiate the trigger condition.

In general, the trigger condition can be fulfilled when the measurement conditions change, in particular by an amount that exceeds a specified threshold value. In addition, it is possible to detect changes in measurement conditions, in particular changes during the measurement caused by a movement of the subject under examination or, as a result of the measurement, caused by a change in hardware conditions of the magnetic resonance system used for the measurement.

If the acquired measurement data MDS1.m are diffusion measurement data for diffusion measurements of the subject under examination, a change in the b-value can be used as the trigger condition so that, for instance, as a result of the changes in the b-value that are specified in the measurement sequence, the trigger condition is automatically fulfilled whenever the b-value has been changed. Thus calibration data are determined that are adapted for each measured b-value. The change in the b-values changes the measurement conditions, which can result in image distortions and artifacts, for instance caused by altered eddy currents. Updating the calibration data KD for each b-value can reduce or even prevent the effects of such distortions and artifacts.

Additionally or alternatively, for an acquisition of diffusion measurement data, a change in the measured diffusion direction can be used as the trigger condition, for example so that the trigger condition is fulfilled automatically (also) when a direction in which the diffusion values are measured is changed and hence a diffusion gradient orientation is changed. Again, such a change in direction is usually specified in the measurement sequence and hence can be used easily as the trigger condition. Thus calibration data is determined that is adapted for each measured diffusion direction. The change in the diffusion direction again changes the measurement conditions, which can result in image distortions and artifacts, for instance caused by altered eddy currents. Updating the calibration data KD for each diffusion direction can reduce or even prevent the effects of such distortions and artifacts.

Additionally or alternatively, for acquisition of any type of measurement data, a manual trigger can be used, for instance produced by a user input that sets the trigger condition to "fulfilled". Thus the trigger condition can be fulfilled by a manual trigger signal. A manual trigger makes it possible to provide a user with calibration data, which is adapted for reconstructing the image data, at any time, for instance when considered necessary, for example as a result of a manual change to the measurement conditions or of observing the obtained image data.

If is also conceivable, however, to cause the trigger condition to be fulfilled whenever a certain time interval, e.g. 5 minutes, has passed, so that latest calibration data is determined regularly.

Figure 3:
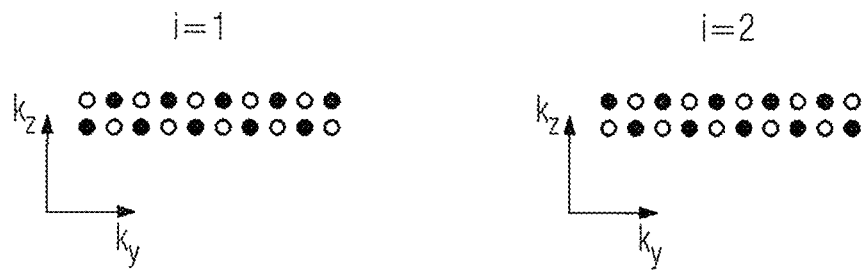
FIG. 3 schematically illustrates a simple example of different sampling patterns according to the invention.

FIG. 3 shows a simple example of n=2 different sampling patterns to be employed, illustrating by way of example the principle of k-space sampling having a FOV shift factor of FOV/2 for a first acquisition (i=1) using the sampling pattern shown on the left, and a repetition of the acquisition (i=2) using the sampling pattern shown on the right. In this figure, as already in FIG. 1, the $k_x$-direction lies perpendicular to the plane of the page. Thus FIG. 3 shows a Cartesian sampling pattern. The method can be applied analogously also for non-Cartesian sampling patterns, for instance radial or spiral sampling patterns.

Figure 1:
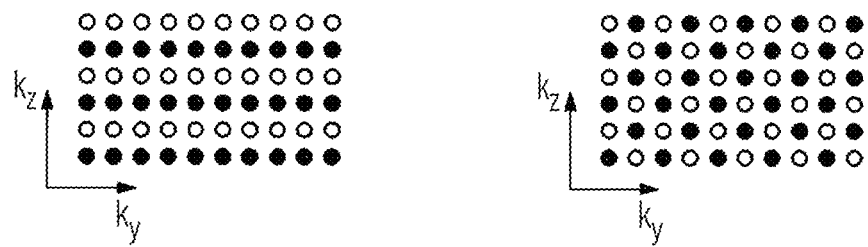
FIG. 1 is an illustration of contrasting, different known k-space sampling patterns for parallel acquisition techniques.

In FIG. 3, as in FIG. 1, acquired k-space points are shown as black-filled circles whereas k-space points that have not been acquired are shown as white-filled circles. In the first acquisition, shown on the left, in the $k_y$-direction, every second k-space point is shifted in the $k_z$-direction by additionally applied phases $\phi_1$. This can be achieved, for instance, by applying a CAIPIRINHA technique. In the repetition, shown on the right, the additional phases $\phi_i$ are changed such that again in the $k_y$-direction, every second k-space point is shifted in the $k_z$-direction by additionally applied phases $\phi_2$, although in the repetition, precisely those k-space points are shifted in the $k_z$-direction that were not shifted in the first acquisition. Thus in the example shown, by simple permutation of the k-space points assigned additional phases $\phi_i$, it is possible to obtain sampling patterns that, from a three-dimensional viewpoint, are different and in combination fully sample k-space, so that both for measurement datasets that were acquired using the sampling pattern i=1 and for measurement datasets that were acquired using the sampling pattern i=1, calibration data can be obtained from the combined measurement data from at least the desired central region of k-space of both an acquisition using the sampling pattern i=1 and an acquisition using a sampling pattern i=2.

For other acceleration factors and/or FOV shift factors, such a permutation of the k-space points to which additional phases have been applied can be performed analogously for each sampling pattern, where the number n of the repetitions needed for full sampling, at least in regions, depends on the acceleration factors and FOV shift factors used.

For example, for a FOV shift factor of FOV/2, the required k-space region could be fully sampled in n=3 repetitions using three sampling patterns, in each of which the k-space points assigned additionally applied phase amounts $\phi_i$ are the subject of the permutation.

Figure 4:
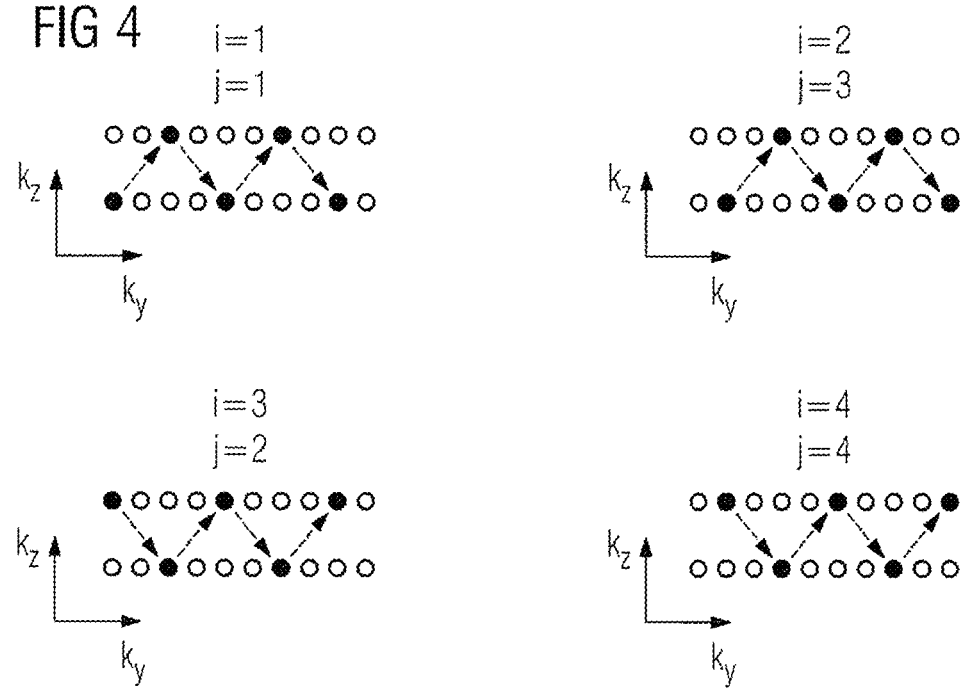
FIG. 4 schematically illustrates another example of different sampling patterns according to the invention.

FIG. 4 schematically shows another example of different sampling patterns i=1, i=2, i=3 and i=4 according to the invention. The sampling patterns i=1 to i=4 each correspond to sampling patterns having acceleration factors SMS=2 (i.e. collapsed acquisition of measurement data from two slices) and PPA=2 (i.e. within the slices, only half of the measurement points required according to Nyquist are measured, the other half to be replenished using parallel acquisition techniques), and were determined by cyclic permutation in the ky-direction of the k-space positions to which additional phase amounts $\phi_i$ are to be applied.

Analogously to FIG. 3, a combination (at least in a required central region of k-space) of the measurement data acquired on the basis of all the four sampling patterns shown in FIG. 4 again results in a complete (in the combined region) set of measurement data, from which calibration data can be determined according to the invention.

If the goal is to determine, from the calibration data, slice separation data for separating the signals contained in collapsed form in acquired measurement data into slice measurement datasets for the respective individual slices, the sequence in which the different sampling patterns are used for successive acquisitions of measurement data can be selected such that the (at least in the central region of k-space) combined measurement data from the measurement datasets acquired first according to the defined sequence, mutually provide complete measurement data in the slice direction in k-space (the kz-direction in this example) initially, and only subsequently in other directions.

A possible sequence of this type for the example of FIG. 4 is indicated by the index j in FIG. 4. In this sequence of the sampling patterns j=1, j=2, j=3 and j=4, with the second repetition of the acquisition of the measurement data (using sampling pattern j=2), the measurement data is already acquired that replenishes the measurement data acquired by the first acquisition of measurement data (using sampling pattern j=1) in the kz-direction to produce a complete set of measurement data (in the kz-direction). The measurement data acquired in the repetition of the acquisition of the measurement data using sampling pattern j=3 is replenished in the kz-direction by the measurement data acquired in the next repetition of the acquisition of the measurement data (using sampling pattern j=4) to produce a complete set of measurement data (in the kz-direction). Thus even after only a portion of the repetitions to be performed overall using different sampling patterns (in the example shown after only two repetitions in each case), it is possible to determine from the measurement data acquired in these repetitions, calibration data that is complete, at least in the kz-direction (slice direction), and from which slice separation data can be determined. If only measurement datasets acquired in an accelerated manner using an SMS acceleration factor are acquired, then updated calibration data can be determined already after only said portion of the repetitions to be performed overall using different sampling patterns.

In the case that replenishment data need to be produced (for replenishing incomplete slice measurement datasets from the individual slices), however, at least one repetition of acquisitions of measurement data is still necessary for each of the repetitions to be performed using different sampling patterns in order to determine calibration data that is also complete in the other directions.

FIG. 5 shows schematically a magnetic resonance apparatus 1 according to the invention. This has a scanner with a basic field magnet 3 that generates the basic magnetic field, a gradient coil arrangement 5 that emits the gradient fields, a radio-frequency antenna arrangement 7 for emitting and receiving radio-frequency signals, and a control computer 9 designed to implement the method according to the invention. In FIG. 5, these sub-units of the magnetic resonance apparatus 1 are not shown in detail. In particular, the radio-frequency antenna arrangement 7 may have multiple sub-units, in particular at least two coils such as the coils 7.1 and 7.2 shown schematically, which may be designed solely to transmit radio-frequency signals or solely to receive the induced radio-frequency signals, or be designed to do both.

In order to examine a subject U under examination, for example a patient or a phantom, the subject can be introduced into the measurement volume of the scanner on a bed L. The slices S1 and S2 represent examples of two different slices of the subject under examination, which slices can be measured simultaneously in an acquisition of MR signals.

The control computer 9 controls the magnetic resonance scanner and in particular controls the gradient coil arrangement 5 via a gradient controller 5' and controls the radio-frequency antenna arrangement 7 via a radio-frequency transmit/receive controller 7'. The radio-frequency antenna arrangement 7 can have multiple channels via which signals can be individually transmitted or received.

The radio-frequency antenna arrangement 7 together with its radio-frequency transmit/receive controller 7' is responsible for generating and radiating (transmitting) an alternating radio-frequency field for manipulating the spins in a region to be manipulated (in particular into different slices S1 and S2) of the subject under examination U. The center frequency of this alternating radio-frequency field, also referred to as the B1 field, should lie close to the resonant frequency of the spins to be manipulated. In order to generate the B1 field, currents are applied to the RF coils, which currents are set in the radio-frequency antenna arrangement 7 by the radio-frequency transmit/receive controller 7'. A multiband RF pulse processor 7a, which can be a component of the radio-frequency transmit/receive controller 7', computes (formulates) multiband RF pulses for simultaneous manipulation of different slices S1, S2 in the subject under examination U.

In addition, the control computer 9 has a phase determination processor 15, for determining phase amounts to be applied additionally according to the invention for the different sampling patterns.

A processing circuit 13 of the control computer 9 is designed to perform all the processing operations needed for the required measurements and determinations. Intermediate results and results required for this purpose or calculated in this process can be saved in a memory S of the control computer 9. The units shown need not necessarily be interpreted here as physically separate units but merely constitute a subdivision into logic units, which, however, can be implemented in fewer physical units or even in just one physical unit.

Via an input/output device E/A of the magnetic resonance apparatus 1, a user can enter control commands to the magnetic resonance apparatus 1 and/or to display results from the control computer 9, e.g. such as image data.

The method described herein can be represented as program code of electronically readable data storage medium 26 that cause the control computer 9 to perform the described method when the data storage medium 26 is bodied therein.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating magnetic resonance (MR) measurement data from a subject, comprising:
    (a) operating an MR acquisition scanner to repeatedly radiate an RF excitation pulse that selectively excites nuclear spins in at least two non-overlapping slices in the subject, while switching gradients in order to produce echo signals in said at least two slices resulting from the gradients and the RF excitation pulses, and detecting MR measurement data corresponding to the echo signals and entering the acquired MR measurement data into k-space in one measurement dataset for each repetition along a sampling pattern that is considered three-dimensionally, with the sampling pattern being different in each repetition and with each sampling pattern undersampling the measurement data in the measurement dataset according to the Nyquist criterion, with a combination of the respective sampling patterns in the respective repetitions completely sampling at least a central region of k-space, and storing the respective measurement datasets in a dataset memory;
    (b) in a processor, accessing the stored measurement datasets from the dataset memory and determining calibration data from the measurement data of the accessed stored measurement datasets from the completely sampled central region of k-space;
    (c) reconstructing image data for each of said slices from the stored measurement dataset thereof, using said calibration data; and
    (d) repeating (a) and (c), with latest calibration data being determined once from latest measurement data, and using the latest calibration data to reconstruct image data for said slices from said latest measurement data.

2. A method as claimed in claim 1 wherein said gradients define a slice direction, and comprising using, as said different sampling patterns, sampling patterns that have identical undersampling but different shifts in the image domain in the slice direction.

3. A method as claimed in claim 1 comprising employing, as said different sampling patterns, sampling patterns that differ from each other by a permutation of k-space positions of the sampling patterns with assigned additional phase values.

4. A method as claimed in claim 3 wherein said permutation is a cyclic permutation.

5. A method as claimed in claim 1 comprising always determining said calibration data in each repetition.

6. A method as claimed in claim 1 comprising determining said latest calibration data only for respective repetitions in which a trigger condition is fulfilled.

7. A method as claimed in claim 6 wherein said trigger condition is fulfilled when a measurement condition is changed by a user input into said processor.

8. A method as claimed in claim 6 wherein said trigger condition is fulfilled when a detected change in a measurement condition, which occurs during acquisition of said measurement data, exceeds a predetermined threshold value, with said measurement condition being selected from the group consisting of movement of the examination subject and a change in a hardware state of hardware in said MR data acquisition scanner.

9. A method as claimed in claim 6 comprising operating said MR data acquisition scanner to acquire said measurement data as diffusion measurement data in a diffusion measurement wherein said gradients include a diffusion gradient having a b-value associated therewith, and wherein said trigger condition is fulfilled when a change in said b-value, or a change in direction along which said diffusion measurement data are measured, exceeds a predetermined threshold value during the acquisition of said diffusion measurement data.

10. A method as claimed in claim 6 wherein said trigger condition is fulfilled by one of entry of a manual trigger signal into said processor, or passage of a predetermined time duration.

11. A method as claimed in claim 1 comprising, in said processor, generating three-dimensional calibration datasets from said calibration data, and using said three-dimensional calibration datasets to additionally fill the respective measurement datasets that are undersampled.

12. A method as claimed in claim 1 comprising, in said processor, determining slice separation data from said calibration data, said slice separation data separating respective MR signals in the acquired measurement datasets into respective slice measurement datasets for the respective slices.

13. A method as claimed in claim 12 comprising generating said slice measurement datasets still in undersampled form, and using said calibration data in said processor to fill missing data in said slice measurement datasets so as to produce complete slice measurement datasets.

14. A method as claimed in claim 12 comprising operating said MR data acquisition scanner with said gradients defining a slice direction, as well as other directions in k-space, and using a sequence of said different sampling patterns in successive acquisitions of said measurement data, and selecting said sequence so that, when the successively acquired measurement data are combined, complete measurement data exists at least in said central region of k-space initially in said slice direction, and only subsequently in said other directions.

15. A magnetic resonance (MR) apparatus comprising:
an MR data acquisition scanner;
a computer configured to operate said MR acquisition scanner to (a) repeatedly radiate an RF excitation pulse that selectively excites nuclear spins in at least two non-overlapping slices in the subject, while switching gradients in order to produce echo signals in said at least two slices resulting from the gradients and the RF excitation pulses, and detecting MR measurement data corresponding to the echo signals and entering the acquired MR measurement data into k-space in one measurement dataset for each repetition along a sampling pattern that is considered three-dimensionally, with the sampling pattern being different in each repetition and with each sampling pattern undersampling the measurement data in the measurement dataset according to the Nyquist criterion, with a combination of the respective sampling patterns in the respective repetitions completely sampling at least a central region of k-space, and storing the respective measurement datasets in a dataset memory;
said computer being configured to (b) access the stored measurement datasets from the dataset memory and determining calibration data from the measurement data of the accessed stored measurement datasets from the completely sampled central region of k-space;
said computer being configured to (c) reconstruct image data for each of said slices from the stored measurement dataset thereof, using said calibration data; and
said computer being configured to repeat (a) and (c), with latest calibration data being determined once from latest measurement data, and using the latest calibration data to reconstruct image data for said slices from said latest measurement data.

16. A non-transitory, computer-readable data storage medium encoded with programming instructions, said storage medium being loaded into a computer of a magnetic resonance (MR) apparatus comprising an MR data acquisition scanner, and said programming instructions causing said computer to:
(a) operate the MR acquisition scanner to repeatedly radiate an RF excitation pulse that selectively excites nuclear spins in at least two non-overlapping slices in the subject, while switching gradients in order to produce echo signals in said at least two slices resulting from the gradients and the RF excitation pulses, and detecting MR measurement data corresponding to the echo signals and entering the acquired MR measurement data into k-space in one measurement dataset for each repetition along a sampling pattern that is considered three-dimensionally, with the sampling pattern being different in each repetition and with each sampling pattern undersampling the measurement data in the measurement dataset according to the Nyquist criterion, with a combination of the respective sampling patterns in the respective repetitions completely sampling at least a central region of k-space, and storing the respective measurement datasets in a dataset memory;
(b) access the stored measurement datasets from the dataset memory and determining calibration data from the measurement data of the accessed stored measurement datasets from the completely sampled central region of k-space;
(c) reconstruct image data for each of said slices from the stored measurement dataset thereof, using said calibration data; and
(d) repeat (a) and (c), with latest calibration data being determined once from latest measurement data, and using the latest calibration data to reconstruct image data for said slices from said latest measurement data.

* * * * *